(12) United States Patent
Maki et al.

(10) Patent No.: US 10,096,970 B2
(45) Date of Patent: Oct. 9, 2018

(54) LIGHT-EMITTING ELEMENT MODULE, ATOMIC OSCILLATOR, AND ELECTRONIC APPARATUS

(71) Applicant: Seiko Epson Corporation, Tokyo (JP)

(72) Inventors: Yoshiyuki Maki, Suwa (JP); Tsunenori Shibata, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/695,469

(22) Filed: Sep. 5, 2017

(65) Prior Publication Data

US 2018/0069373 A1    Mar. 8, 2018

(30) Foreign Application Priority Data

Sep. 7, 2016  (JP) ................................. 2016-174918

(51) Int. Cl.

| | |
|---|---|
| *H01S 5/02* | (2006.01) |
| *H01S 5/024* | (2006.01) |
| *G04F 5/14* | (2006.01) |
| *H01S 5/06* | (2006.01) |
| *H01S 5/0687* | (2006.01) |
| *H03B 17/00* | (2006.01) |
| *H03L 7/26* | (2006.01) |

(Continued)

(52) U.S. Cl.
CPC .......... *H01S 5/02415* (2013.01); *G04F 5/145* (2013.01); *H01S 5/0612* (2013.01); *H01S 5/0687* (2013.01); *H03B 17/00* (2013.01); *H03L 7/26* (2013.01); *H01L 27/153* (2013.01); *H01L 27/18* (2013.01); *H01L 27/20* (2013.01); *H01L 27/22* (2013.01); *H01L 2224/49171* (2013.01); *H01L 2924/19107* (2013.01); *H01S 5/02276* (2013.01)

(58) Field of Classification Search
CPC .. H01S 5/02415; H01S 5/0612; H01S 5/0687; H01S 5/02276; H01S 5/022; H01S 5/02208; H01S 5/0222; H01S 5/02476
See application file for complete search history.

(56) References Cited

U.S. PATENT DOCUMENTS

| | | | |
|---|---|---|---|
| 2013/0200955 A1* | 8/2013 | Chindo | F21V 29/00 331/94.1 |
| 2015/0221846 A1* | 8/2015 | Terauchi | H01S 5/02415 136/203 |
| 2016/0329681 A1* | 11/2016 | Tulip | H01S 5/02415 |

FOREIGN PATENT DOCUMENTS

| | | |
|---|---|---|
| JP | 07-104332 A | 4/1995 |
| JP | 2013-162031 A | 8/2013 |

* cited by examiner

*Primary Examiner* — Armando Rodriguez
(74) *Attorney, Agent, or Firm* — Harness, Dickey & Pierce, P.L.C.

(57) ABSTRACT

A light-emitting element module includes: a Peltier device that includes a first substrate, and a second substrate causing a temperature difference from the first substrate, and a power terminal disposed on the first substrate; a light-emitting element that is disposed on a side of the second substrate of the Peltier device and of which temperature is adjusted by the Peltier device; a temperature sensor that is disposed on the side of the second substrate of the Peltier device; a package that includes a base and a lid; a first external electrode that is electrically connected to the power terminal; a second external electrode that is electrically connected to the temperature sensor; and a third external electrode that is electrically connected to the light-emitting element. The third external electrode is disposed between the first and second external electrodes.

7 Claims, 9 Drawing Sheets

(51) Int. Cl.
*H01L 27/15* (2006.01)
*H01L 27/18* (2006.01)
*H01L 27/20* (2006.01)
*H01L 27/22* (2006.01)
*H01S 5/022* (2006.01)

LIGHT-EMITTING ELEMENT MODULE, ATOMIC OSCILLATOR, AND ELECTRONIC APPARATUS

This application claims priority to Japanese Patent Application No. 2016-174918, filed Sep. 7, 2016, the entirety of which is hereby incorporated by reference.

BACKGROUND

1. Technical Field

The present invention relates to a light-emitting element module, an atomic oscillator, and an electronic apparatus.

2. Related Art

In order to control temperatures of light-emitting elements and maintain oscillation states of light with predetermined wavelengths, there are known light-emitting element modules that adjust temperatures of the light-emitting elements using a Peltier device (for example, see JP-A-7-104332).

A laser light-emitting device which is disclosed in JP-A-7-104332 and is an example of the light-emitting element module includes a semiconductor laser element (light-emitting element), a thermistor, an electronic thermo-element (Peltier device) using the Peltier effect, and a package accommodating them. Here, the semiconductor laser element and thermistor are disposed on the electronic thermo-element, and thus is mounted on the inner surface of the package via the electronic thermo-element. Then, by adjusting temperature of the semiconductor laser element by the electronic thermo-element while measuring the temperature of the semiconductor laser element by the thermistor, the temperature of the semiconductor laser element is controlled to predetermined temperature.

In the laser light-emitting device disclosed in JP-A-7-104332, the semiconductor laser element, the thermistor, and the electronic thermo-element are connected to terminals disposed on the outer surface of the package via interconnections, thereby achieving electric conduction with the outside of the package.

However, in the related art, the thermistor is affected by temperature of the electronic thermo-element opposite to the thermistor via the terminals and the interconnections disposed in the package, and thus a deviation between the measured temperature of the thermistor and the actual temperature of the semiconductor laser element may increases. As a result, there is a problem that precision of the temperature control of the semiconductor laser element deteriorates.

SUMMARY

An advantage of some aspects of the invention is to provide a light-emitting element module capable of reducing deterioration in precision of temperature control of a light-emitting element and provides an atomic oscillator, an electronic apparatus, and a vehicle that include the light-emitting element module and have excellent reliability.

The invention can be implemented as the following forms or application examples.

A light-emitting element module according to an application example of the invention includes: a Peltier device that includes a first substrate, and a second substrate causing a temperature difference from the first substrate, and a power terminal disposed on the first substrate; a light-emitting element that is disposed on a side of the second substrate of the Peltier device and of which temperature is adjusted by the Peltier device; a temperature sensor that is disposed on the side of the second substrate of the Peltier device and measures temperature of the light-emitting element; a package that includes a base and a lid which is joined to the base, in which an internal space accommodating the Peltier device, the light-emitting element and the temperature sensor is formed between the base and the lid; a first external electrode that is disposed on an outer surface of the base and is electrically connected to the power terminal; a second external electrode that is disposed on the outer surface of the base and is electrically connected to the temperature sensor; and a third external electrode that is disposed on the outer surface of the base and is electrically connected to the light-emitting element. The third external electrode is disposed between the first and second external electrodes when viewed in a direction in which the light-emitting element and the Peltier device overlap each other.

In the light-emitting element module according to the application example, the third external electrode is disposed between the first and second external electrodes. Thus, it is possible to increase a distance between the first and second external electrodes. Therefore, since it is possible to reduce movement of heat between the first and second external electrodes, it is possible to reduce an increase in deviation between a measured temperature of the temperature sensor and an actual temperature of the light-emitting element due to the influence of the temperature of the first substrate included in the Peltier device. As a result, it is possible to reduce deterioration in precision of the temperature control of the light-emitting element.

It is preferable that the light-emitting element module according to the application example includes a first internal electrode that is disposed on an inner surface of the base and is electrically connected to the power terminal and the first external electrode; a second internal electrode that is disposed on the inner surface of the base and is electrically connected to the temperature sensor and the second external electrode; and a third internal electrode that is disposed on the inner surface of the base and is electrically connected to the light-emitting element and the third external electrode, and the third internal electrode is disposed between the first and second internal electrodes when viewed in the direction in which the light-emitting element and the Peltier device overlap each other.

With this configuration, it is possible to increase the distance between the first and second internal electrodes. Therefore, it is possible to reduce movement of heat between the first and second internal electrodes. Therefore, it is possible to reduce an increase in deviation between a measured temperature of the temperature sensor and an actual temperature of the light-emitting element due to the influence of the temperature of the first substrate included in the Peltier device.

In the light-emitting element module according to the application example, it is preferable that, when viewed in the direction in which the light-emitting element and the Peltier device overlap each other, the first internal electrode and the first external electrode overlap at least partially, the second internal electrode and the second external electrode overlap at least partially, and the third internal electrode and the third external electrode overlap at least partially.

With this configuration, it is possible to increase the distance between the first and second internal electrodes. Therefore, it is possible to further effectively reduce the deterioration in the precision of the temperature control of the light-emitting element.

In the light-emitting element module according to the application example, it is preferable that, when viewed in the direction in which the light-emitting element and the Peltier device overlap each other, the light-emitting element is disposed between the power terminal and the temperature sensor.

With this configuration, for example, it can be easy to separate the interconnection connected to the power terminal from the interconnection connected to the temperature sensor. Therefore, it is possible to further effectively reduce the deterioration in the precision of the temperature control of the light-emitting element.

In the light-emitting element module according to the application example, it is preferable that, when viewed in the direction in which the light-emitting element and the Peltier device overlap each other, an outer shape of the base is quadrangular, and the first and second external electrodes are disposed in different corners of the base.

With this configuration, it is easy to dispose the first and second external electrodes to be separated from each other.

It is preferable that the light-emitting element module according to the application example further includes a heat dissipation member that is disposed to be in contact with the outer surface of the base and dissipates heat of the base.

With this configuration, since heat of the base can be dissipated by the heat dissipation member, it is possible to effectively reduce movement of heat between the first and second external electrodes.

In the light-emitting element module according to the application example, it is preferable that a contact portion of the heat dissipation member and the base is eccentrically located to the side of the first external electrode than the second external electrode of the base.

With this configuration, it is possible to more effectively reduce an increase in deviation between a measured temperature of the temperature sensor and an actual temperature of the light-emitting element due to the influence of the temperature of the first substrate included in the Peltier device.

An atomic oscillator according to an application example of the invention includes the light-emitting element module according to the application example.

The atomic oscillator includes the light-emitting element module capable of reducing deterioration in precision of temperature control of the light-emitting element. Therefore, by reducing a variation in the wavelength of light from the light-emitting element, it is possible to realize the atomic oscillator that has an excellent oscillation property using the light.

An electronic apparatus according to an application example of the invention includes the light-emitting element module according to the application example.

The electronic apparatus includes the light-emitting element module capable of reducing deterioration in precision of temperature control of the light-emitting element. Therefore, it is possible to realize the electronic apparatus that has a high property using high-quality light.

A vehicle according to an application example of the invention includes the light-emitting element module according to the application example.

The vehicle includes the light-emitting element module capable of reducing deterioration in precision of temperature control of the light-emitting element. Therefore, it is possible to realize the vehicle that has a high property using high-quality light.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a light-emitting element module, an atomic oscillator, an electronic apparatus, and a vehicle will be described in detail with reference to the appended drawings according to embodiments.

1. Atomic Oscillator

First, an atomic oscillator (an atomic oscillator including a light-emitting element module) will be described.

Figure 1:
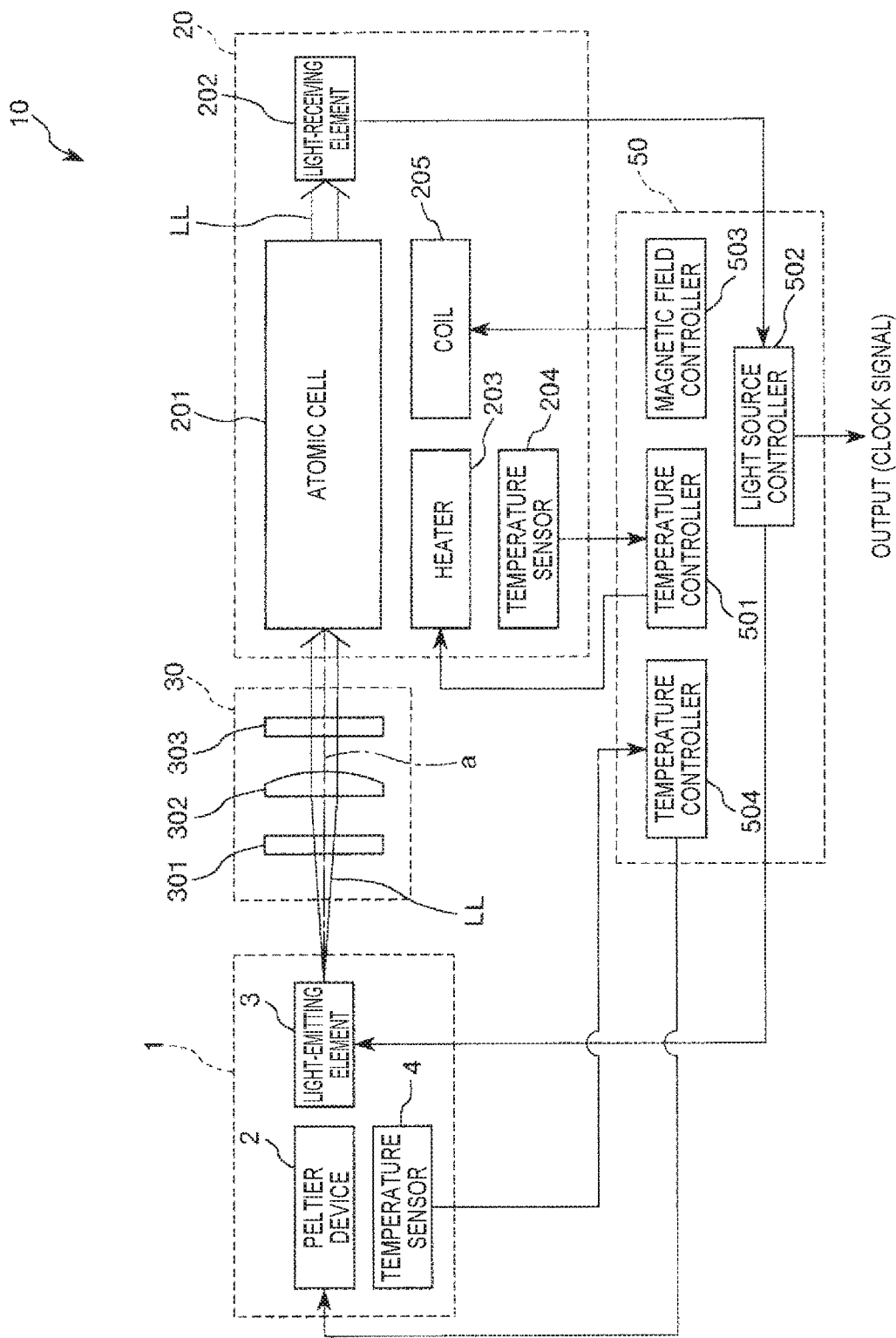
FIG. 1 is a schematic diagram illustrating an atomic oscillator according to an embodiment.

FIG. 1 is a schematic diagram illustrating an atomic oscillator according to an embodiment.

An atomic oscillator 10 illustrated in FIG. 1 is an atomic oscillator that uses coherent population trapping (CPT) in which a phenomenon occurs in which two pieces of resonance light are transmitted without being absorbed by alkali metal atoms when the two pieces of resonance light with specific different wavelengths are simultaneously radiated to the alkali metal atoms. The phenomenon of the coherent population trapping is also called an electromagnetically induced transparency (EIT) phenomenon.

As illustrated in FIG. 1, the atomic oscillator 10 includes a light-emitting element module 1, an atomic cell unit 20, an optical system unit 30 disposed between the light-emitting element module 1 and the atomic cell unit 20, and a controller 50 that controls operations of the light-emitting element module 1 and the atomic cell unit 20. Hereinafter, an overview of the atomic oscillator 10 will be described first.

The light-emitting element module 1 includes a Peltier device 2, a light-emitting element 3, and a temperature sensor 4. The light-emitting element 3 emits linearly polarized light LL containing two types of light with different frequencies. The temperature sensor 4 measures temperature of the light-emitting element 3. The Peltier device 2 adjusts the temperature of the light-emitting element 3 (heats or cools the light-emitting element 3).

The optical system unit 30 includes a light reduction filter 301, a lens 302, and a quarter wavelength plate 303. The light reduction filter 301 reduces the intensity of the light LL from the above-described light-emitting element 3. The lens 302 adjusts the angle of radiation of the light LL (for example, adjusts the light LL to parallel light). The quarter wavelength plate 303 converts two types of light with different frequencies contained in the light LL from linearly polarized light to circularly polarized light (right-handed circularly polarized light or left-handed circularly polarized light).

The atomic cell unit 20 includes an atomic cell 201, a light-receiving element 202, a heater 203, a temperature sensor 204, and a coil 205.

The atomic cell 201 has light transmittance and alkali metal is sealed inside the atomic cell 201. An alkali metal atom has energy levels of three level systems formed by two different ground levels and an excited level. The light LL from the light-emitting element 3 is incident on the atomic cell 201 via the light reduction filter 301, the lens 302, and the quarter wavelength plate 303. Then, the light-receiving element 202 receives and detects the light LL passing through the atomic cell 201.

The heater 203 heats the alkali metal inside the atomic cell 201 to change at least a part of the alkali metal into a gas state. The temperature sensor 204 measures temperature of the atomic cell 201. The coil 205 applies a magnetic field in a predetermined direction to the alkali metal inside the atomic cell 201 to perform Zeeman splitting on the energy levels of the alkali metal atoms. When the pair of pieces of circularly polarized resonance light described above are radiated to the alkali metal atoms in a state in which the alkali metal atoms are subjected to the Zeeman splitting in this way, the number of alkali metal atoms in a specific energy level among the plurality of levels at which the alkali metal atoms are subjected to the splitting can be relatively greater than the number of alkali metal atoms at another energy level. Therefore, it is possible to increase the number of atoms realizing a specific EIT phenomenon, raise a specific EIT signal, and consequently improve an oscillation property of the atomic oscillator 10.

The controller 50 includes a temperature controller 501, a light source controller 502, a magnetic field controller 503, and a temperature controller 504. Based on a measurement result of the temperature sensor 204, the temperature controller 501 controls electrification to the heater 203 such that a preferred temperature is maintained inside the atomic cell 201. The magnetic field controller 503 controls electrification to the coil 205 such that the magnetic field generated by the coil 205 is constant. Based on a measurement result of the temperature sensor 4, the temperature controller 504 controls electrification to the Peltier device 2 such that the temperature of the light-emitting element 3 is maintained at a preferred temperature (within a temperature region).

Based on a detection result of the light-receiving element 202, the light source controller 502 controls the frequencies of two types of light contained in the light LL from the light-emitting element 3 such that an EIT phenomenon occurs. Here, the EIT phenomenon occurs when the two types of light become the pair of pieces of resonance light with a frequency difference equivalent to an energy difference between two ground levels of the alkali metal atoms inside the atomic cell 201. The light source controller 502 includes a voltage controlled crystal oscillator (not illustrated) of which an oscillation frequency is controlled for stabilization in synchronization with control of the frequencies of the two types of light described above and outputs an output signal of the voltage controlled crystal oscillator (VCXO) as an output signal (clock signal) of the atomic oscillator 10.

An overview of the atomic oscillator 10 has been described. Hereinafter, a more specific configuration of the atomic oscillator 10 will be described with reference to FIGS. 2 and 3.

Figure 2:
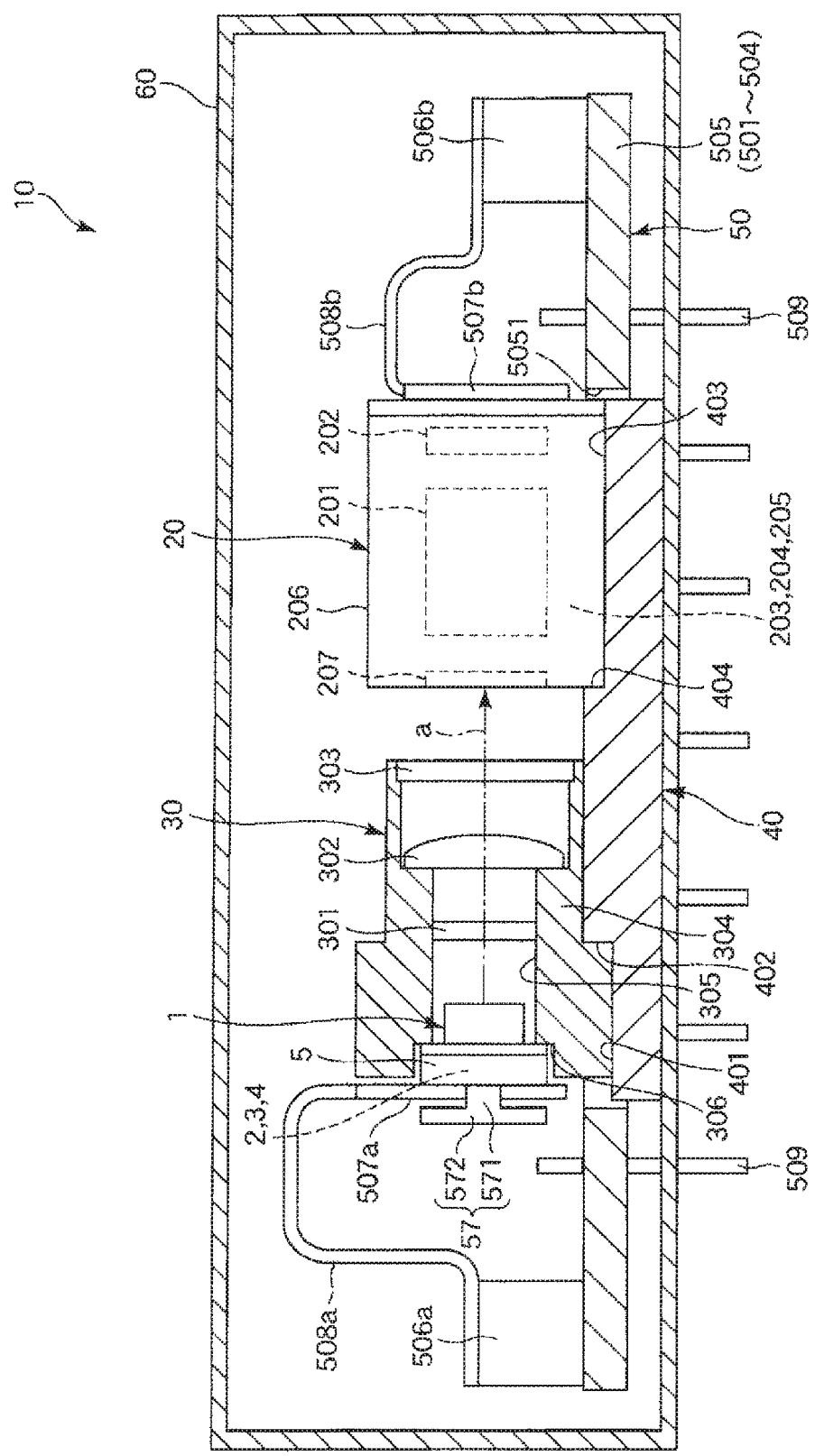
FIG. 2 is a sectional side view illustrating the atomic oscillator illustrated in FIG. 1.
Figure 3:
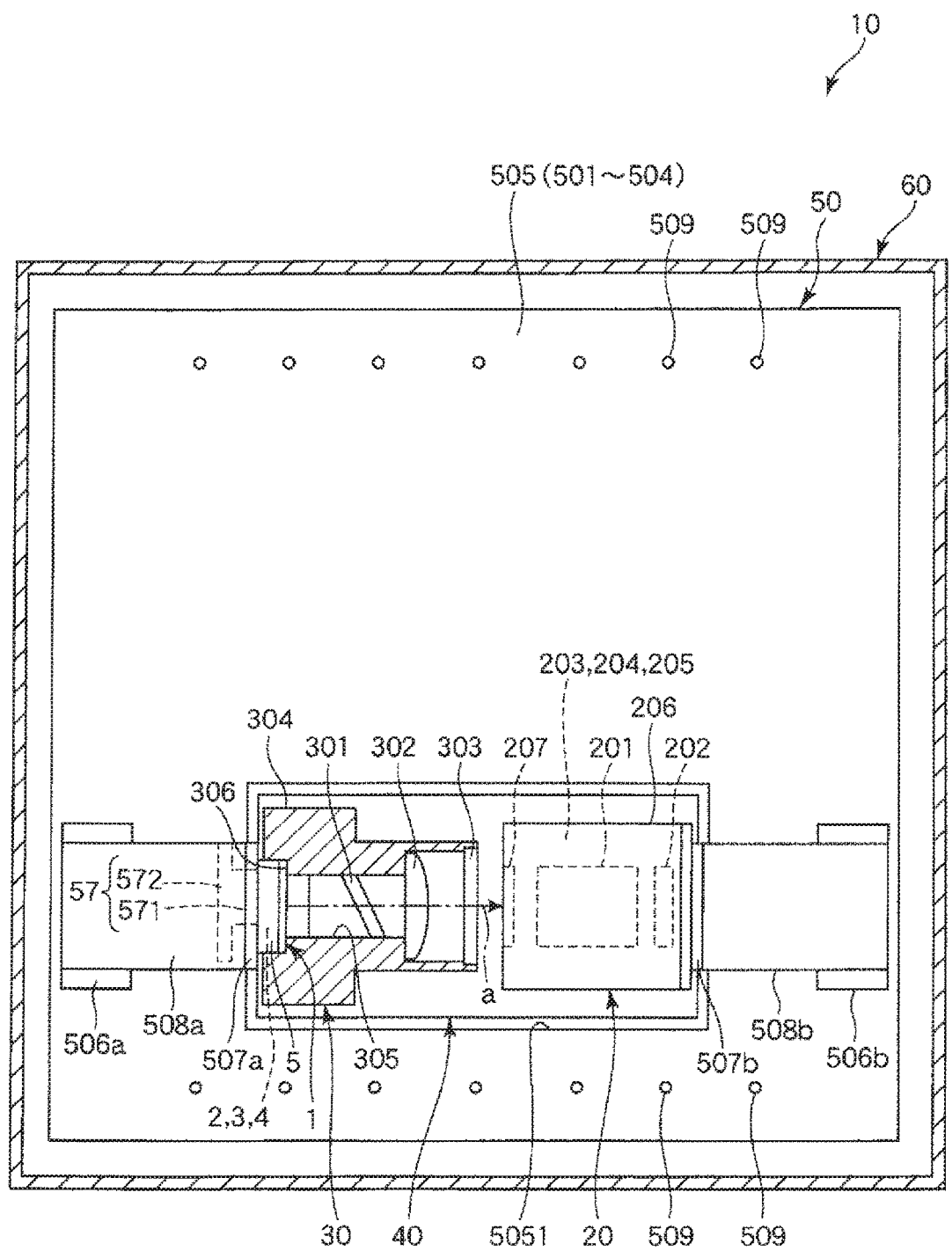
FIG. 3 is a plan view illustrating the atomic oscillator illustrated in FIG. 2.

FIG. 2 is a sectional side view illustrating the atomic oscillator illustrated in FIG. 1. FIG. 3 is a plan view illustrating the atomic oscillator illustrated in FIG. 2. Hereinafter, the upper side in FIG. 2 is referred to as a "top" and the lower side is referred to as a "bottom" to facilitate the description.

As illustrated in FIG. 2, the atomic oscillator 10 includes a light-emitting element module 1, an atomic cell unit 20, an optical system unit 30 that holds the light-emitting element module 1, a hold member 40 that collectively holds the atomic cell unit 20 and the optical system unit 30, a controller 50 that is electrically connected to the light-emitting element module 1 and the atomic cell unit 20, and a package 60 that accommodates them.

The light-emitting element module 1 includes the Peltier device 2, the light-emitting element 3, the temperature sensor 4, a package 5 accommodating them, and a heat dissipation member 57. The light-emitting element module 1 will be described below in detail.

The optical system unit 30 includes a light reduction filter 301, a lens 302, a quarter wavelength plate 303, and a holder 304 that holds them. Here, the holder 304 includes through-holes 305 with a pillar shape of which both ends are open. The through-hole 305 is a passage region of the light LL. The light reduction filter 301, the lens 302, and the quarter wavelength plate 303 are disposed in this order inside the through-hole 305. As illustrated in FIG. 3, the light reduction filter 301 is fixed to the holder 304 by an adhesive or the like (not illustrated) to be inclined with respect to a surface that has the optical axis a as a normal line. The lens 302 and the quarter wavelength plate 303 are fixed to the holder 304 by an adhesive or the like (not illustrated) along a surface that has the optical axis a as a normal line. The light-emitting element module 1 is mounted on an end of the through-hole 305 close to the light reduction filter 301 (the left of FIG. 2). The holder 304 is formed of, for example, a metal material such as aluminum and has a heat dissipation property. In this way, it is possible to efficiently dissipate the heat from the light-emitting element module 1.

The optical system unit 30 may not include at least one of the light reduction filter 301 and the lens 302 depending on the intensity of the light LL from the light-emitting element 3, a radiation angle, or the like. The optical system unit 30 may include an optical element other than the light reduction filter 301, the lens 302, and the quarter wavelength plate 303. The disposition order of the light reduction filter 301, the lens 302, and the quarter wavelength plate 303 is not limited to the illustrated order and the light reduction filter 301, the lens 302, and the quarter wavelength plate 303 may be disposed in any order.

The atomic cell unit 20 includes the atomic cell 201, a light-receiving element 202, a heater 203, a temperature sensor 204, a coil 205, and a package 206 that accommodates them.

An alkali metal such as rubidium, cesium, or sodium in a gaseous form is sealed inside the atomic cell 201. In the atomic cell 201, a noble gas such as argon or neon or an inert gas such as nitrogen may be sealed as a buffer gas along with the alkali metal gas, as necessary.

Although not illustrated, the atomic cell 201 includes, for example, a trunk portion that has a through-hole with a pillar and one pair of window portions that form an internal space sealed airtight by sealing both openings of the through-hole of the trunk portion. Here, the light LL incident on the atomic cell 201 is transmitted through one window portion between the pair of window portions and the light LL emitted from the inside of the atomic cell 201 is transmitted through the other window portion. Accordingly, a material used to form each window portion may have transmittance with respect to the light LL and is not particularly limited. For example, a glass material or a quartz crystal can be exemplified. On the other hand, a material used to form the trunk portion is not particularly limited and a metal material, a resin material, a glass material, a silicon material, and a quartz crystal can be exemplified. From the viewpoint of workability or joining with each window portion, it is desirable to use a glass material or a silicon material. A method of joining the trunk portion with each window portion can be determined according to the material and is not particularly limited. For example, a direct joining method or an anode joining method can be used.

The light-receiving element 202 is disposed to be opposite to the light-emitting element module 1 with respect to the atomic cell 201. The light-receiving element 202 is not particularly limited as long as the light-receiving element can detect the intensity of the light LL (the pair of pieces of resonance light) transmitted through the atomic cell 201. For example, a solar cell or a light detector (light-receiving element) such as a photodiode is exemplified.

Although not illustrated, for example, the heater 203 is disposed on the above-described atomic cell 201 or is connected to the atomic cell 201 via a thermal conductive member such as a metal. The heater 203 is not particularly limited as long as the atomic cell 201 (more specifically, the alkali metal inside the atomic cell 201) can be heated. For example, a Peltier device or any of various heaters having a heating resistor can be exemplified.

Although not illustrated, for example, the temperature sensor 204 is disposed near the atomic cell 201 or the heater 203. The temperature sensor 204 is not particularly limited as long as the temperature of the atomic cell 201 or the heater 203 can be measured. For example, various known temperature sensors such as a thermistor or a thermocouple can be exemplified.

Although not illustrated, for example, the coil 205 is a solenoid type coil disposed to be wound around the outer circumference of the atomic cell 201 or a pair of Helmholtz coils facing each other with the atomic cell 201 interposed therebetween. The coil 205 generates a magnetic field in a direction (a parallel direction) along the optical axis a of the light LL inside the atomic cell 201. In this way, a gap between different energy levels at which the alkali metal atoms inside the atomic cell 201 are degenerated can be spread by Zeeman splitting to improve a resolution and the line width of the EIT signal can be reduced. The magnetic field generated by the coil 205 may be one magnetic field between a direct-current magnetic field and an alternating-current magnetic field or may be a magnetic field in which a direct-current magnetic field and an alternating-current magnetic field are superimposed.

Although not illustrated, the package 206 includes, for example, a plate-shaped substrate and a cover joined to the substrate. An airtight space in which the atomic cell 201, the light-receiving element 202, the heater 203, the temperature sensor 204, and the coil 205 described above are accommodated is formed between the substrate and the cover. Here, the substrate directly or indirectly holds the atomic cell 201, the light-receiving element 202, the heater 203, the temperature sensor 204, and the coil 205. A plurality of terminals electrically connected to the light-receiving element 202, the heater 203, the temperature sensor 204, and the coil 205 are disposed on the outer surface of the substrate. On the other hand, the cover forms a bottom cylinder of which one end is open and the opening is blocked by the substrate. A window portion 207 that has transmission properties for the light LL is disposed at the other end (bottom portion) of the cover.

A material of portions other than the window portion of the cover and the substrate of the package 206 is not particularly limited. For example, a ceramics or a metal can be exemplified. As a material of the window portion 207, for example, a glass material can be exemplified. A method of joining the substrate to the cover is not particularly limited. For example, soldering, seam welding, or energy line welding (laser welding, electron beam welding, or the like) can be exemplified. The package 206 is internally depressurized than the atmospheric pressure. In this way, it is possible to control the temperature of the atomic cell 201 simply and with high precision. As a result, it is possible to improve the property of the atomic oscillator 10.

The hold member 40 is formed in a plate shape. The atomic cell unit 20 and the optical system unit 30 described above are placed on one surface of the hold member 40. The hold member 40 has an installation surface 401 formed along the shape of the lower surface of the holder 304 of the optical system unit 30. A stepped portion 402 is formed on the installation surface 401. The stepped portion 402 engages with the stepped portion of the lower surface of the holder 304 and regulates movement of the holder 304 toward the side of the atomic cell unit 20 (the right side of FIG. 2). Similarly, the hold member 40 has an installation surface 403 formed along the shape of the lower surface of the package 206 of the atomic cell unit 20. A stepped portion 404 is formed on the installation surface 403. The stepped portion 404 engages with the boundary of the package 206 (the boundary on the left side of FIG. 2) and regulates movement of the package 206 toward the side of the optical system unit 30 (the left side of FIG. 2).

In this way, the hold member 40 can regulate a relative positional relation between the atomic cell unit 20 and the optical system unit 30. Here, since the light-emitting element module 1 is fixed to the holder 304, a relative positional relation of the light-emitting element module 1 relative to the atomic cell unit 20 and the optical system unit 30 is also regulated. Here, the package 206 and the holder 304 are fixed to the hold member 40 by a fixing member such as a screw (not illustrated). The hold member 40 is fixed to the package 60 by a fixing member such as a screw (not illustrated). The hold member 40 is formed of, for example, a metal material such as aluminum and has a heat dissipation property. In this way, it is possible to efficiently dissipate the heat from the light-emitting element module 1.

As illustrated in FIG. 3, the controller 50 includes a circuit substrate 505, two connectors 506a and 506b disposed on the circuit substrate 505, a rigid wiring substrate 507a connected to the light-emitting element module 1, a rigid wiring substrate 507b connected to the atomic cell unit 20, a flexible wiring substrate 508a to which the connector 506a and the rigid wiring substrate 507a are connected, a flexible wiring substrate 508b to which the connector 506b and the rigid wiring substrate 507b are connected, and a plurality of lead pins 509 penetrating the circuit substrate 505.

Here, an integrated circuit (IC) chip (not illustrated) is disposed in the circuit substrate 505. The IC chip functions as the temperature controller 501, the light source controller 502, the magnetic field controller 503, and the temperature controller 504 described above. The circuit substrate 505 includes a through-hole 5051 into which the above-described hold member 40 is inserted. The circuit substrate 505 is held by the package 60 via the plurality of lead pins 509. The plurality of lead pins 509 are electrically connected to the circuit substrate 505.

The configuration in which the circuit substrate 505 is electrically connected to the light-emitting element module 1 and the configuration in which the circuit substrate 505 is electrically connected to the atomic cell unit 20 are not limited to the connectors 506a and 506b, the rigid wiring substrates 507a and 507b, and the flexible wiring substrates 508a and 508b illustrated in the drawing, but other known connectors and interconnections may be used.

The package 60 is formed of, for example, a metal material such as Kovar and has a magnetic shielding property. In this way, it is possible to reduce an adverse influence of an external magnetic field on the property of the atomic oscillator 10. The package 60 may be internally depressurized or may be at the atmospheric pressure.

Detailed Description of Light-Emitting Element Module

Figure 4:
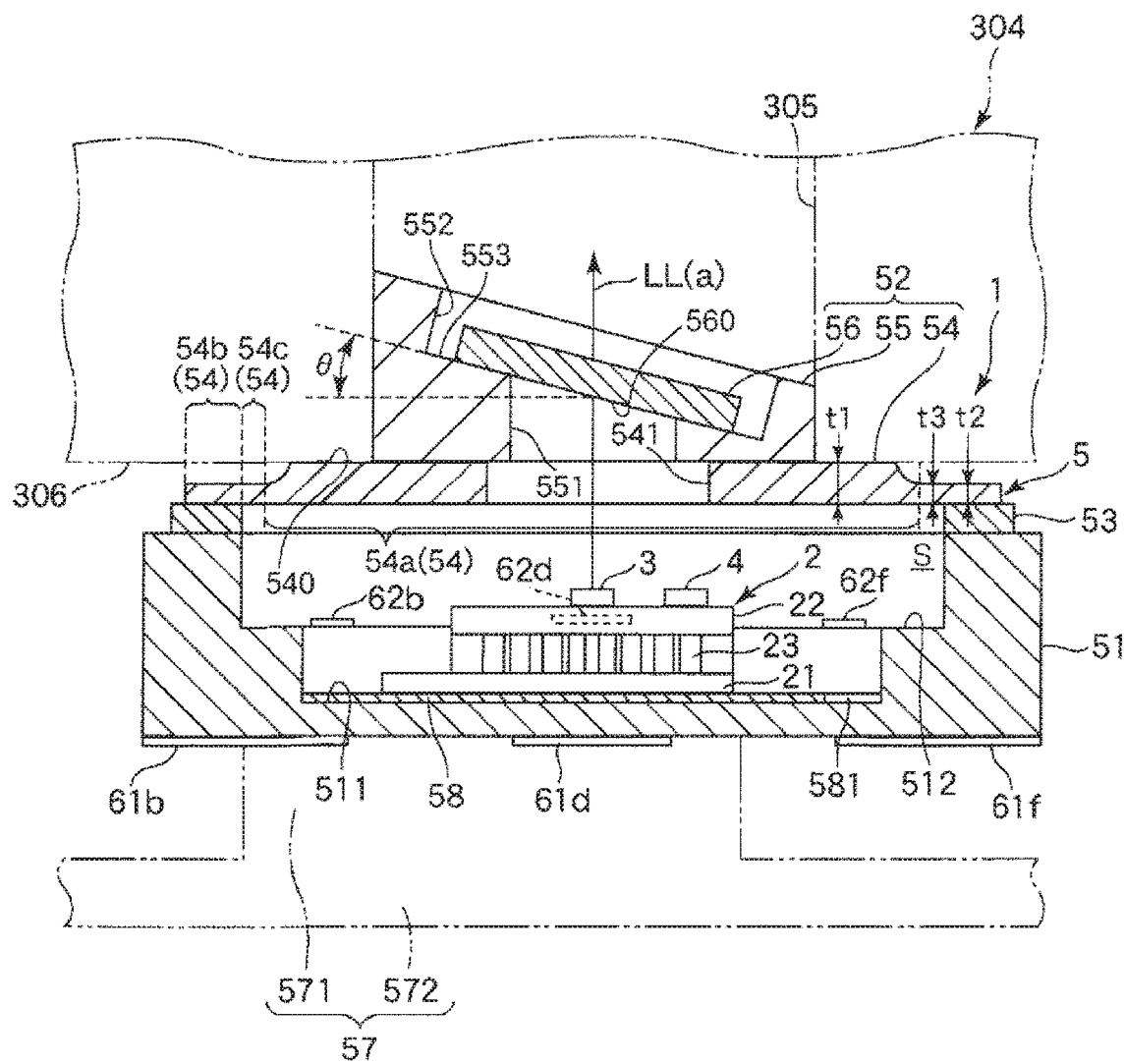
FIG. 4 is a sectional view illustrating a light-emitting element module included in the atomic oscillator illustrated in FIGS. 2 and 3.
Figure 5:
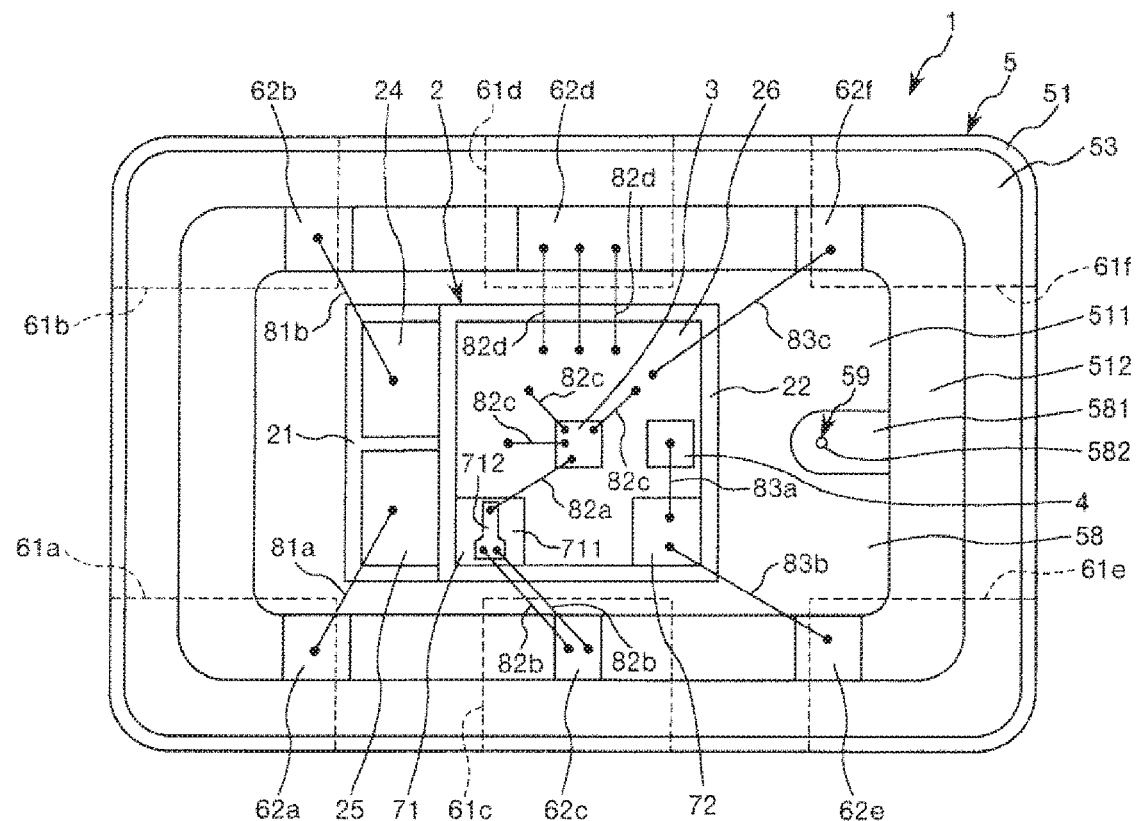
FIG. 5 is a plan view illustrating the light-emitting element module illustrated in FIG. 4.
Figure 6:
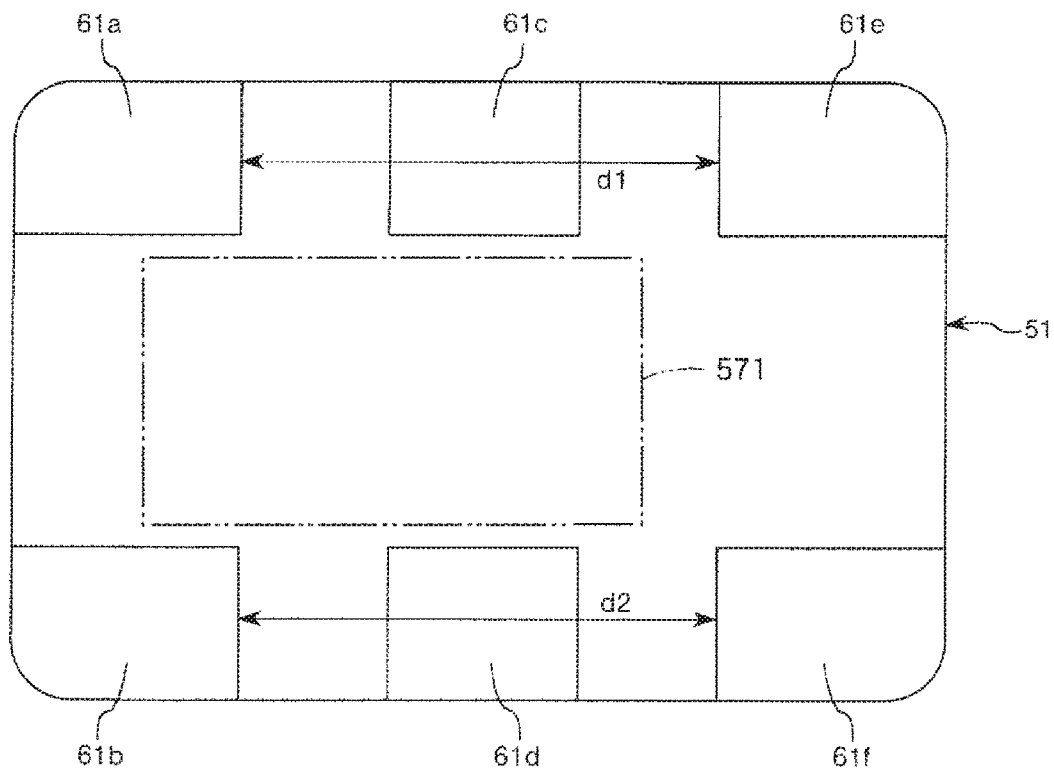
FIG. 6 is a bottom view illustrating the light-emitting element module illustrated in FIG. 4.
Figure 7:
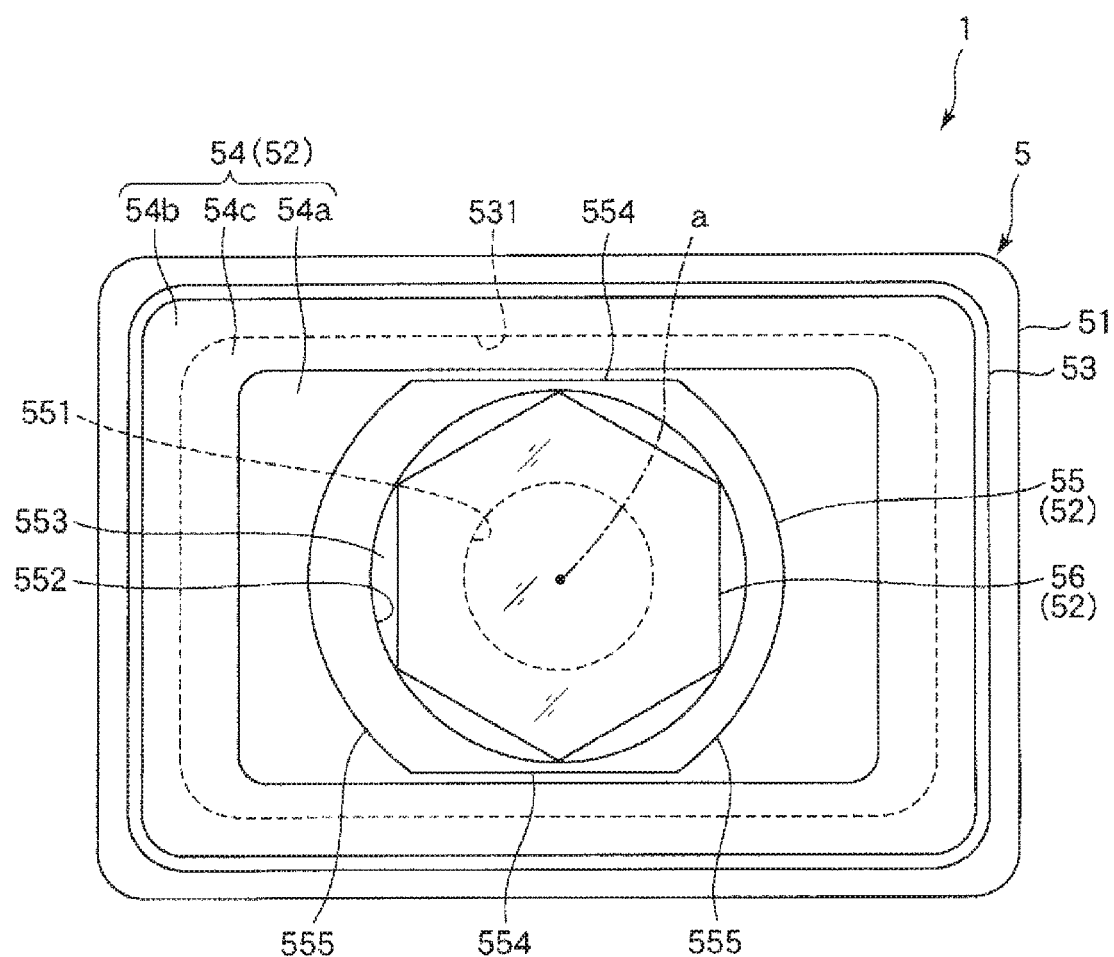
FIG. 7 is a plan view illustrating a lid included in the light-emitting element module illustrated in FIG. 4.

FIG. 4 is a sectional view illustrating a light-emitting element module included in the atomic oscillator illustrated in FIGS. 2 and 3. FIG. 5 is a plan view illustrating the light-emitting element module illustrated in FIG. 4. FIG. 6 is a bottom view illustrating the light-emitting element module illustrated in FIG. 4. FIG. 7 is a plan view illustrating a lid included in the light-emitting element module illustrated in FIG. 4. Hereinafter, to facilitate the description, the upper side in FIG. 4 is referred to as a "top" and the lower side is referred to as a "bottom". In addition, a "plan view" refers to the direction of the optical axis a, that is, a state when viewed in a direction in which the light-emitting element 3 and the Peltier device 2 overlap each other.

As illustrated in FIG. 4, the light-emitting element module 1 includes the Peltier device 2, the light-emitting element 3, the temperature sensor 4, the package 5 that accommodates them, and the heat dissipation member 57. The package 5 includes a base 51 and a lid 52. The heat dissipation member 57 is disposed to be in contact with an outer surface of the base 51.

The package 5 is formed in a quadrangular shape in the plan view and includes a base 51 that includes a depression portion 511 open toward the upper surface and a lid 52 that blocks an opening (upper opening) of the depression portion 511. An internal space S which is an airtight space in which the Peltier device 2, the light-emitting element 3, and the temperature sensor 4 are accommodated is formed between the base 51 and the lid 52. A hole 582 communicating the outside and inside of the depression portion 511 is formed in the bottom portion of the base 51. The hole 582 is filled with a sealing member 59 formed of various metal materials. Thus, the hole 582 is sealed. The hole 582 can be used to vacuumize the internal space S. After the air is removed from the internal space S through the hole 582, the hole 582 is sealed with the sealing member 59. Thus, the internal space S can be formed as an airtight space. In particular, the internal space S is preferably in a depressurized (vacuum) state. Thus, it is possible to reduce an influence of an external temperature change of the package 5 on the light-emitting element 3, the temperature sensor 4, or the like inside the package 5, and thus it is possible to reduce a variation in the temperature of the light-emitting element 3, the temperature sensor 4, or the like inside the package 5. The package 5 may not be in the depressurized state either and an inert gas such as nitrogen, helium, or argon may be sealed.

A material of the base 51 is not particularly limited. A material that has an insulation property and is suitable for forming the internal space S as an airtight space, for example, various kinds of ceramics such as oxide-based ceramics such as alumina, silica, titania, and zirconia, nitride-based ceramics such as silicon nitride, aluminum nitride, and titanium nitride, and carbide-based ceramics such as silicon carbide, can be used.

A grounding electrode 58 is disposed on the bottom surface of the depression portion 511 of the base 51. For example, the grounding electrode 58 has a function of shielding intrusion of electromagnetic waves or the like into the internal space S from the outside. As illustrated in FIGS. 4 and 5, the grounding electrode 58 includes a deficit portion 581 formed to expose the hole 582 and is formed on the nearly entire region of the bottom surface of the depression portion 511. In the embodiment, the bottom surface of the depression portion 511 is formed in a quadrangular shape (rectangular shape) in the plan view. The hole 582 and the deficit portion 581 are located on one short side (the right side of FIG. 5) of the bottom surface of the depression portion 511. In particular, the hole 582 and the deficit portion 581 are located in the middle of one short side.

The base 51 includes a stepped portion 512 formed on the upper side of the bottom surface of the depression portion 511. The stepped portion 512 is formed in a quadrangular frame shape that surrounds the outer circumference of the bottom surface of the depression portion 511 formed in the quadrangular shape in the plan view.

As illustrated in FIG. 5, two first internal electrodes 62a and 62b (internal electrodes), two third internal electrodes 62c and 62d (internal electrodes), and two second internal electrodes 62e and 62f (internal electrodes) are disposed on the upper surface of the stepped portion 512. The first internal electrodes 62a and 62b and the second internal electrodes 62e and 62f are disposed in the corners of the stepped portion 512 formed in the quadrangular frame shape. The third internal electrode 62c is disposed between the first internal electrode 62a and the second internal electrode 62e to be separated therefrom in the plan view. The third internal electrode 62d is disposed between the first internal electrode 62b and the second internal electrode 62f to be separated therefrom in the plan view.

As illustrated in FIG. 6, two first external electrodes 61a and 61b (external electrodes), two third external electrodes 61c and 61d (external electrodes), and two second external electrodes 61e and 61f (external electrodes) are disposed on the lower surface of the base 51. The first external electrodes 61a and 61b and the second external electrodes 61e and 61f are disposed in the corners of the lower surface of the base 51 formed in the quadrangular frame shape in the plan view. The third external electrode 61c is disposed between the first external electrode 61a and the second external electrode 61e to be separated therefrom in the plan view. The third external electrode 61d is disposed between the first external electrode 61b and the second external electrode 61f to be separated therefrom in the plan view.

As illustrated in FIG. 5, the first internal electrode 62a, the first internal electrode 62b, the third internal electrode 62c, the third internal electrode 62d, the second internal electrode 62e, the second internal electrode 62f (hereinafter also referred to as "internal electrodes 62a to 62f") described above have overlap portions with the first external electrode 61a, the first external electrode 61b, the third external electrode 61c, the third external electrode 61d, the second external electrode 61e, and the second external electrode 61f (hereinafter also referred to as "external electrodes 61a to 61f"), respectively, in the plan view. The internal electrodes 62a and 62f are electrically connected to the external electrodes 61a to 61f via through-electrodes (not illustrated) penetrating the base 51, respectively.

Materials of the internal electrodes 62a to 62f and the external electrodes 61a to 61f are not particularly limited. For example, metal materials such as gold (Au), a gold alloy, platinum (Pt), aluminum (Al), an aluminum alloy, silver (Ag), a silver alloy, chromium (Cr), a chromium alloy, nickel (Ni), copper (Cu), molybdenum (Mo), niobium (Nb), tungsten (W), iron (Fe), titanium (Ti), cobalt (Co), zinc (Zn), and zirconium (Zr) can be exemplified.

A seal ring 53 with a frame shape (circular shape) is disposed on the upper boundary of the base 51. The seal ring 53 is formed of, for example, a metal material such as Kovar and is joined to the base 51 by soldering or the like. The lid 52 is joined to the base 51 via the seal ring 53 by seam welding or the like.

As illustrated in FIGS. 4 and 7, the lid 52 includes a body portion 54 that has a plate shape, a protrusion portion 55 that is disposed on the body portion 54 and has a cylindrical shape, and a window portion 56 that blocks a hole 551 (opening) formed inside the protrusion portion 55.

The body portion 54 includes a first portion 54a that holds the protrusion portion 55, a second portion 54b that is joined to the base 51 (more specifically, the base 51 via the seal ring 53), and a third portion 54c that connects the first portion 54a to the second portion 54b. Here, a thickness t2 of the second portion 54b and a thickness t3 of the third portion 54c are thinner than a thickness t1 of the first portion 54a. The thickness t2 of the second portion 54b is the same as the thickness t3 of the third portion 54c. In the embodiment, when outer circumference of the thickness t2 of the body portion 54 is divided into two portions using the inner circumference edge 531 of the seal ring 53 as a boundary in a plan view for ascertainment, the inner portion of the two portions can be said to be the second portion 54b and the inner portion can be said to be the third portion 54c. The thickness of the outer circumference portion of the first portion 54a is continuously thinned toward the third portion 54c. In this way, the upper surface and the lower surface of the first portion 54a are continuously connected to the upper surface and the lower surface of the third portion 54c. A hole 541 penetrated in the thickness direction is formed in the first portion 54a. At least apart of the light LL from the light-emitting element 3 passes through the hole 541. A material of the body portion 54 is not particularly limited. A metal material is suitably used. It is desirable to use a metal material with a linear expansion coefficient similar to that of the material of the base 51. Accordingly, for example, when the base 51 is formed of a ceramics substrate, it is desirable to use an alloy such as Kovar as the material of the body portion 54.

The protrusion portion 55 inwardly includes a hole 551 that communicates with the hole 541 of the above-described body portion 54 and a hole 552 that communicates with the hole 551 opposite to the hole 541 with respect to the hole 551. At least a part of the light LL from the light-emitting element 3 passes through each of the holes 551 and 552. Here, the width (diameter) of the hole 552 is greater than the width (diameter) of the hole 551. Thus, a stepped portion 553 is formed between the holes 551 and 552. The stepped portion 553 is inclined at an inclination angle θ with respect to the plate surface 540 (upper surface) of the above-described body portion 54. As illustrated in FIG. 7, the outer circumferential surface of the protrusion portion 55 includes a pair of curved surfaces 555 formed along a cylindrical surface and a pair of flat portions 554 flat and formed between the one pair of curved surfaces 555. The one pair of flat portions 554 is formed along the outer shape of the first portion 54a of the body portion 54 in the plan view, thereby ensuring the third portion 54c of the above-described body portion 54. By forming the one pair of flat portions 554, it is easy to weld the base 51 and the lid 52. By forming the one pair of curved surfaces 555, it is possible to ensure necessary mechanical strength of the protrusion portion 55.

A material of the protrusion portion 55 may be different from the material of the body portion 54. However, it is desirable to use a metal material with a linear expansion coefficient similar to that of the material of the body portion 54 and it is more desirable to use the same material as the material of the body portion 54. The protrusion portion 55 may be formed to be separate from the body portion 54 to be joined by a known joining method or may be formed to be integrated (collectively) with the body portion 54 using a mold.

The window portion 56 formed of a plate-shaped member through which the light LL passes is disposed inside the hole 552. The window portion 56 is joined onto the above-described stepped portion 553 by a known joining method and blocks the opening of the hole 551 of the above-described protrusion portion 55 on the side of the hole 552. Here, since the stepped portion 553 is inclined at the inclination angle θ with respect to the plate surface 540 of the body portion 54, as described above, a surface 560 of the window portion 56 on the side of the light-emitting element 3 is also inclined at the inclination angle θ with respect to the plate surface 540 of the body portion 54. The inclination angle θ is not particularly limited, but is preferably equal to or greater than 5 degrees and equal to or less than 45 degrees. Thus, it is possible to reduce an adverse influence on the property of the light-emitting element 3 since the light LL from the light-emitting element 3 is reflected by the window portion 56 and is incident as return light on the light-emitting element 3. The window portion 56 has a transmission property for the light LL from the light-emitting element 3. A material of the window portion 56 is not particularly limited. For example, a glass material can be exemplified. The window portion 56 may be an optical component such as a lens or a light reduction filter.

The inclination direction of the surface 560 of the window portion 56 on the side of the light-emitting element 3 is not limited to the illustrated inclination direction. For example, the window portion 56 may be disposed in a state at which the window portion 56 is rotated at 30°, 60°, 90°, 180°, or 210° clockwise in FIG. 7.

On the lid 52, as illustrated in FIG. 4, the body portion 54 and the protrusion portion 55 engage with the holder 304 of the above-described optical system unit 30 to be positioned. More specifically, the plate surface 540 of the body portion 54 comes into contact with a positioning surface 306 of the holder 304, so that the lid 52 and the light-emitting element module 1 are positioned in the direction of the optical axis a of the light-emitting element 3. When the protrusion portion 55 is inserted into the through-hole 305 of the holder 304 and side surfaces (more specifically, the one pair of curved surfaces 555 described above) of the protrusion portion 55 to come into contact with the inner wall surface of the through-hole 305, the lid 52 and the light-emitting element module 1 are positioned in a direction vertical to the optical axis a of the light-emitting element 3. By bringing the body portion 54 and the protrusion portion 55 in contact with the holder 304 in this way, it is possible to reduce the temperature of the lid 52 because of heat dissipation from the holder 304 which is formed of a metal material and has a heat dissipation property.

The heat dissipation member 57 is disposed to be in contact with the lower surface of the base 51 of the package 5. The heat dissipation member 57 includes a first portion 571 connected to the base 51 and a second portion 572 connected to the first portion 571 to be separated from the base 51. The second portion 572 is formed in a flat plate shape formed along the lower surface of the base 51. A contact portion of the first portion 571 and the base 51 is eccentrically located to the side of the first external electrodes 61a and 61b than the second external electrodes 61f and 61e of the base 51. The heat dissipation member 57 has a function of dissipating heat of the base 51 (a function of heat sink). The heat dissipation member 57 is fixed to the holder 304 by a screw, an adhesive, or the like (not illustrated) to tightly press the base 51 against the holder 304. The shape of the heat dissipation member 57 is not particularly limited. For example, the heat dissipation member 57 may have, for example, a plurality of heat dissipation pins. Thus, it is possible to improve the heat dissipation property.

Any material may be used as a material of the heat dissipation member 57 as long as the heat dissipation member 57 exerts the function of dissipating heat of the base 51 in consideration of the material of the base 51. For example, aluminum, an alloy of aluminum, copper, an alloy of copper, stainless steel, steel, or the like can be exemplified.

Thermal conductivity of the heat dissipation member 57 is preferably higher than thermal conductivity of the base 51. Specifically, the thermal conductivity of the heat dissipation member 57 is preferably equal to or greater than 10 W·m−1·k−1, more preferably equal to or greater than 40 W·m−1·k−1, and further more preferably equal to or greater than 100 W·m−1·k−1.

The Peltier device 2 is disposed on the bottom surface of the depression portion 511 of the base 51 of the package 5 via the grounding electrode 58. The Peltier device 2 is fixed to the grounding electrode 58 by, for example, an adhesive. As illustrated in FIG. 4, the Peltier device 2 includes a first substrate 21 (substrate), a second substrate 22 (substrate) facing the first substrate 21, and a joint 23 disposed between the first substrate 21 and the second substrate 22. The first substrate 21 and the second substrate 22 are each formed of a material that has excellent thermal conductivity such as a metal material or a ceramic material. An insulation film is formed on each of the surface of the first substrate 21 and the surface of the second substrate 22, as necessary. The lower surface of the first substrate 21 is fixed to the base 51 of the package 5 via the grounding electrode 58. On the other hand, a pair of power terminals 24 and 25 are disposed on the upper surface of the first substrate 21, as illustrated in FIG. 5. The second substrate 22 is disposed so that the one pair of power terminals 24 and 25 are exposed. The one pair of power terminals 24 and 25 are electrically connected to the first internal electrodes 62a and 62b disposed in the package 5 via interconnections 81a and 81b which are wire-interconnections (bonding wires). The joint 23 is configured to include a plurality of joints of two different metals or semiconductors producing the Peltier effect by conduction from the one pair of power terminals 24 and 25.

In the Peltier device 2, one of the first substrate 21 and the second substrate 22 serves as heat generation side and the other substrate serves as a heat dissipation side by the Peltier effect produced in the joint 23. That is, the first substrate 21 and the second substrate 22 causes a difference in temperature. Here, the Peltier device 2 can switch between a state in which the first substrate 21 serves the heat generation side and the second substrate 22 serves as the heat dissipation side and a state in which the first substrate 21 serves as the heat dissipation side and the second substrate 22 serves as the heat generation side in accordance with a direction of a supplied current. Therefore, even when the range of an ambient temperature is wide, the temperature of the light-emitting element 3 or the like can be adjusted to a preferred temperature (target temperature). Thus, it is possible to further reduce an adverse influence (for example, a variation in the wavelength of the light LL) due to a change in the temperature. Here, the target temperature of the light-emitting element 3 can be determined according to the property of the light-emitting element 3. The target temperature is not limited and is, for example, equal to or greater than about 30° C. and equal to or less than about 40° C. The Peltier device 2 is operated at an appropriate time to heat or cool the light-emitting element 3 based on information from the temperature sensor 4 so that the temperature of the light-emitting element 3 can be maintained to the target temperature.

The Peltier device 2 includes a metal layer 26 (not illustrated in FIG. 4) disposed on the upper surface of the second substrate 22. The metal layer 26 is formed of, for example, a metal having excellent thermal conductivity, such as aluminum, gold, or silver. The light-emitting element 3, the temperature sensor 4, and relay members 71 and 72 are disposed on the upper surface of the metal layer 26.

The light-emitting element 3 is, for example, a semiconductor laser such as a vertical cavity surface emitting laser (VCSEL). The semiconductor layer can emit two types of light with different wavelengths by superimposing a light-frequency signal on a direct-current bias current (performing modulation) for use. The light-emitting element 3 includes a pair of terminals (not illustrated). Of the pair of terminals, one terminal is a drive signal terminal and the other terminal is a grounding terminal. The drive signal terminal is electrically connected to the third internal electrode 62c disposed in the package 5 via the interconnection 82a, the relay member 71, and the interconnection 82b. On the other hand, the grounding terminal is electrically connected to the third internal electrode 62d disposed in the package 5 via the interconnection 82c, the metal layer 26, and the interconnection 82d.

The temperature sensor 4 is, for example, a temperature measurement element such as a thermistor or a thermocouple. The temperature sensor 4 includes a pair of terminals (not illustrated). Of the pair of terminals, one terminal is a measurement signal terminal and the other terminal is a grounding terminal. The measurement signal terminal is electrically connected to the second internal electrode 62e disposed in the package 5 via the interconnection 83a, the relay member 72, and the interconnection 83b. On the other hand, the grounding terminal is electrically connected to the second internal electrode 62f disposed in the package 5 via the metal layer 26 and the interconnection 83c.

The interconnections 82a, 82b, 82c, 82d, 83a, 83b, and 83c are wire-interconnections (bonding wires). Here, the interconnection 82b is configured by a plurality of wire-interconnections. In this way, it is possible to reduce electric resistance of the interconnection 82b and reduce loss of a driving signal supplied to the light-emitting element 3. From the same viewpoint, the interconnections 82c and 82d are also configured by a plurality of wire-interconnections.

The relay member 71 includes a base portion 711 that has an insulation property and an interconnection layer 712 that has conductivity and is disposed on the upper surface of the base portion 711. The base portion 711 is formed of, for example, a ceramics material. A metal layer (not illustrated)

is joined to the lower surface of the base portion 711. The metal layer is joined to the metal layer 26 with a joining material (not illustrated) such as a brazing filler metal. The interconnection layer 712 is formed of the same material as that of the above-described internal electrodes 62a to 62f. The interconnection layer 712 is formed in a rectangular shape and is formed in apart of the upper surface of the base portion 711. In this way, even when an electrostatic capacitance between the interconnection layer 712 and the metal layer 26 is small and a high-frequency signal is used as a driving signal supplied to the light-emitting element 3, it is possible to reduce loss of the driving signal. In addition, it is possible to ensure the size of the base portion 711 to some extent and consequently facilitate mounting of the relay member 71.

By electrically connecting the light-emitting element 3 to the third internal electrodes 62c and 62d via the relay member 71 and the like, the temperature of the interconnections 82a, 82b, 82c, and 82d is adjusted by the Peltier device 2. Therefore, it is possible to reduce the variation in the temperature of the interconnections 82a, 82b, 82c, and 82d and also accordingly reduce the variation in the temperature of the light-emitting element 3.

The relay member 72 can be configured similarly to the above-described relay member 71. However, since no high-frequency signal is used in the temperature sensor 4, the interconnection layer included in the relay member 72 may be disposed across the entire region of the upper surface of the base portion.

By electrically connecting the temperature sensor 4 to the second internal electrodes 62e and 62f via the relay member 72 or the like, the temperature of the interconnections 83a, 83b, and 83c is adjusted by the Peltier device 2. Therefore, it is possible to reduce the variation in the temperature of the interconnections 83a, 83b, and 83c and also accordingly reduce the variation in the temperature of the temperature sensor 4. That is, the temperature sensor 4 can be allowed to be rarely affected by heat from the second internal electrodes 62e and 62f. Therefore, it is possible to improve measurement precision of the temperature sensor 4 and consequently control the temperature of the light-emitting element 3 with high precision.

As described above, the light-emitting element module 1 that has the above-described configuration includes: the Peltier device 2 that includes the first substrate 21, the second substrate 22 causing a temperature difference from the first substrate 21, and the power terminals 24 and 25 disposed in the first substrate 21; the light-emitting element 3 that is disposed on the side of the second substrate 22 of the Peltier device 2 and of which temperature is adjusted by the Peltier device 2; the temperature sensor 4 that is disposed on the side of the second substrate 22 of the Peltier device 2 and measures the temperature of the light-emitting element 3; and the package 5 that includes the base 51 and the lid 52 joined to the base 51. The internal space S in which the Peltier device 2, the light-emitting element 3, and the temperature sensor 4 are accommodated is formed between the base 51 and the lid 52. The light-emitting element module 1 includes the first external electrodes 61a and 61b that are disposed on the outer surface (in the embodiment, the lower surface) of the base 51 and are electrically connected to the power terminals 24 and 25, the second external electrodes 61e and 61f that are disposed on the outer surface (the lower surface) of the base 51 and are electrically connected to the temperature sensor 4, and the third external electrodes 61c and 61d that are disposed on the outer surface (the lower surface) of the base 51 and are electrically connected to the light-emitting element 3. When viewed in the direction in which the light-emitting element 3 and the Peltier device 2 overlap each other (in the plan view), the third external electrodes 61c and 61d are disposed between the first external electrodes 61a and 61b and the second external electrodes 61e and 61f (see FIGS. 5 and 6).

Here, as described above, a temperature difference is caused between the first substrate 21 and the second substrate 22 included in the Peltier device 2. Then, the first external electrodes 61a and 61b are affected by the temperature of the first substrate 21 included in the Peltier device 2 via the interconnections 81a and 81b and the first internal electrodes 62a and 62b. On the other hand, the second external electrodes 61e and 61f are affected by the temperature of the second substrate 22 included in the Peltier device 2 via the interconnections 83a, 83b, and 83c and the second external electrodes 61e and 61f. Therefore, a temperature difference is caused between the first external electrodes 61a and 61b and the second external electrodes 61e and 61f.

In the light-emitting element module 1, as illustrated in FIG. 6, by disposing the third external electrodes 61c and 61d between the first external electrodes 61a and 61b and the second external electrodes 61e and 61f, it is possible to increase distances d1 and d2 between the first external electrodes 61a and 61b and the second external electrodes 61e and 61f. Therefore, since the temperature difference is caused between the first external electrodes 61a and 61b and the second external electrodes 61e and 61f, it is possible to reduce movement of heat between the first external electrodes 61a and 61b and the second external electrodes 61e and 61f. Thus, it is possible to reduce an increase in deviation between a measured temperature of the temperature sensor 4 and an actual temperature of the light-emitting element 3 due to the influence of the temperature of the first substrate 21 included in the Peltier device 2. As a result, it is possible to reduce deterioration in precision of the temperature control of the light-emitting element 3.

The light-emitting element module 1 includes the first internal electrodes 62a and 62b that are disposed on the inner surface of the base 51 (in the embodiment, the bottom surface of the depression portion 511) and are electrically connected to the power terminals 24 and 25 and the first external electrodes 61a and 61b, respectively, the second internal electrodes 62e and 62f that are disposed on the inner surface (the bottom surface of the depression portion 511) of the base 51 and are electrically connected to the temperature sensor 4 and the second external electrode 61e and 61f, respectively, and the third internal electrodes 62c and 62d that are disposed on the inner surface (the bottom surface of the depression portion 511) of the base 51 and are electrically connected to the light-emitting element 3 and the third external electrodes 61c and 61d, respectively. When viewed in the direction in which the light-emitting element 3 and the Peltier device 2 overlap each other (in the plan view), the third internal electrodes 62c and 62d are disposed between the first internal electrodes 62a and 62b and the second internal electrodes 62e and 62f (see FIG. 5).

Thus, it is possible to increase the distances between the first internal electrodes 62a and 62b and the second internal electrodes 62e and 62f. Therefore, it is possible to reduce movement of heat between the first internal electrodes 62a and 62b and the second internal electrodes 62e and 62f. Thus, it is possible to further reduce an increase in deviation between a measured temperature of the temperature sensor 4 and an actual temperature of the light-emitting element 3 due to the influence of the temperature of the first substrate 21 included in the Peltier device 2. Therefore, it is possible to reduce deterioration in precision of the temperature control of the light-emitting element 3.

Further, when viewed in the direction in which the light-emitting element 3 and the Peltier device 2 overlap each other (in the plan view), the first internal electrode 62a and the first external electrode 61a have overlapping portions, the second internal electrode 62e and the second external electrode 61e have overlapping portions, and the third internal electrode 62c and the third external electrode 61c have overlapping portions. Similarly, in the plan view, the first internal electrode 62b and the first external electrode 61b have overlapping portions, the second internal electrode 62f and the second external electrode 61f have overlapping portions, and the third internal electrode 62d and the third external electrode 61d have overlapping portions (see FIG. 5).

Thus, it is possible to increase the distances between the first internal electrodes 62a and 62b and the second internal electrodes 62e and 62f. Therefore, it is possible to further effectively reduce the deterioration in the precision of the temperature control of the light-emitting element 3. In particular, as described above, since the third internal electrode 62c and 62d are disposed between the first internal electrode 62a and 62b and the second internal electrode 62e and 62f in the plan view and the internal electrodes 62a to 62f have overlapping portions with the external electrodes 61a to 61f, respectively, in the plan view, it is possible to considerably exert the advantage of reducing the deterioration in the precision of the temperature control of the light-emitting element 3.

As described above, when viewed in the direction in which the light-emitting element 3 and the Peltier device 2 overlap each other (in the plan view), the base 51 has a quadrangular outer shape. The first external electrodes 61a and 61b and the second external electrodes 61e and 61f are disposed in mutually different corners of the base 51 (in the embodiment, the rear surface of the base 51). Similarly, the first external electrode 61b and the second external electrode 61f are disposed in mutually different corners of the base 51 (in the embodiment, the rear surface of the base 51). Thus, it is easy to dispose the first external electrodes 61a and 61b and the second external electrodes 61e and 61f to be separated from each other.

Similarly, the first internal electrodes 62a and 62b and the second internal electrodes 62e and 62f are disposed in corners of the bottom surface of the depression portion 511. Therefore, it is also easy to dispose the second internal electrodes 62e and 62f and the second external electrodes 61e and 61f to be separated from each other.

When viewed in the direction in which the light-emitting element 3 and the Peltier device 2 overlap each other (in the plan view), the light-emitting element 3 is disposed between the power terminals 24 and 25 and the temperature sensor 4 (see FIG. 5).

Thus, it can be easy to separate the interconnections 81a and 81b electrically connected to the power terminals 24 and 25 from the interconnections 83a, 83b, and 83c electrically connected to the temperature sensor 4. Therefore, it is possible to further effectively reduce the deterioration in the precision of the temperature control of the light-emitting element 3. Since the light-emitting element 3 is disposed in the middle of the base 51 in the plan view, it is easy to position the optical axis a of the light LL from the light-emitting element 3 in the optical system unit 30 or the atomic cell unit 20. In the plan view, the above-described third internal electrode 62d is disposed in the middle of the base 51 in the longitudinal direction. In this way, since the third internal electrode 62d is disposed in a space between the first internal electrode 62b and the second internal electrode 62f, it is possible to relatively shorten the length of the interconnection 82d connecting the light-emitting element 3 to the third internal electrode 62d. Thus, even when a high-frequency signal is used as a driving signal supplied to the light-emitting element 3, it is possible to reduce a loss of the driving signal. This is true for the third internal electrode 62c.

As described above, the light-emitting element module 1 includes the heat dissipation member 57 that is disposed to be in contact with the outer surface (in the embodiment, the lower surface) of the base 51 and dissipates heat of the base 51. Thus, since heat of the base 51 can be dissipated by the heat dissipation member 57, it is possible to effectively reduce movement of heat between the first external electrodes 61a and 61b and the second external electrodes 61e and 61f.

The contact portion (the upper surface of the first portion 571) between the heat dissipation member 57 and the base 51 is eccentrically located to the side of the first external electrodes 61a and 61b than the second external electrodes 61f and 61e of the base 51 (see FIGS. 4 and 6). Thus, it is possible to reduce an increase in the deviation between a measured temperature of the temperature sensor 4 and an actual temperature of the light-emitting element 3 due to the influence of the temperature of the first substrate 21 included in the Peltier device 2.

As described above, the internal space S of the package 5 is preferably depressurized more than the atmospheric pressure. Thus, it is possible to effectively reduce a variation in the temperature of the light-emitting element 3 due to a change in the external temperature of the package 5. When the internal space S is depressurized in this way, it is possible to further reduce movement of heat between the interconnections 81a and 81b and the first internal electrodes 62a and 62b affected by the temperature of the first substrate 21 of the Peltier device 2 and the interconnections 83a, 83b, and 83c and the second internal electrodes 62e and 62f affected by the temperature of the second substrate 22 of the Peltier device 2. Therefore, it is possible to effectively reduce an increase in the deviation between a measured temperature of the temperature sensor 4 and an actual temperature of the light-emitting element 3 due to the influence of the temperature of the first substrate 21 included in the Peltier device 2.

The above-described atomic oscillator 10 includes the above-described light-emitting element module 1. By including the light-emitting element module 1, it is possible to reduce the deterioration in the precision of the temperature control of the light-emitting element 3. Therefore, by reducing a variation in the wavelength of the light LL from the light-emitting element 3, it is possible to realize the atomic oscillator 10 that has an excellent oscillation property using the light LL.

2. Electronic Apparatus

The light-emitting element module 1 and the atomic oscillator 10 described above can be embedded in various electronic apparatus. Hereinafter, an electronic apparatus will be described.

Figure 8:
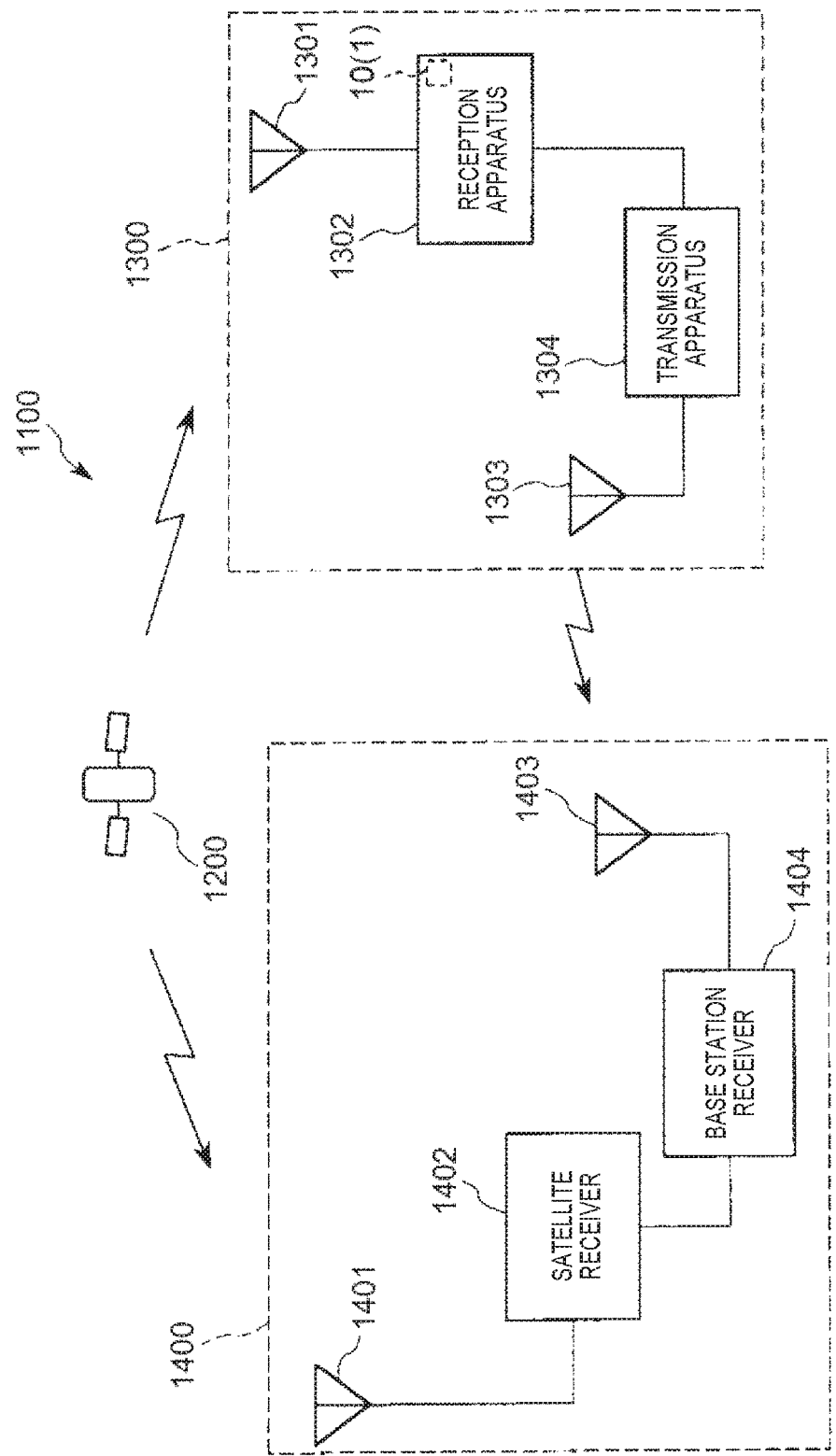
FIG. 8 is a diagram illustrating a schematic configuration when the atomic oscillator is used in a positioning system using GPS satellites.

FIG. 8 is a diagram illustrating a schematic configuration when the atomic oscillator is used in a positioning system using GPS satellites.

A positioning system 1100 illustrated in FIG. 8 is configured to include a GPS satellite 1200, a base station apparatus 1300, and a GPS reception apparatus 1400.

The GPS satellite 1200 transmits positioning information (a GPS signal).

The base station apparatus 1300 includes a reception apparatus 1302 that receives the positioning information with high precision from the GPS satellite 1200 via an antenna 1301 disposed at, for example, an electronic standard point (GPS continuous observation station) and a transmission apparatus 1304 that transmits the positional information received by the reception apparatus 1302 via an antenna 1303.

Here, the reception apparatus 1302 is an electronic apparatus that includes the above-described atomic oscillator (the light-emitting element module 1) as a standard frequency oscillation source. The positional information received by the reception apparatus 1302 is transmitted in real time by the transmission apparatus 1304.

The GPS reception apparatus 1400 includes a satellite receiver 1402 that receives the positioning information from the GPS satellite 1200 via an antenna 1401 and a base station receiver 1404 that receives the positional information from the base station apparatus 1300 via an antenna 1403.

The reception apparatus 1302 which is an "electronic apparatus" included in the foregoing positioning system 1100 includes the above-described light-emitting element module 1. In this way, it is possible to reduce the deterioration in precision of the temperature control of the light-emitting element 3. Therefore, it is possible to realize the reception apparatus 1302 that has a high property using the light LL from the light-emitting element 3.

The electronic apparatus including the light-emitting element module according to the invention is not limited to the above-described electronic apparatus. The invention can be applied to, for example, a smartphone, a tablet terminal, a timepiece, a mobile phone, a digital still camera, an ink jet ejection apparatus (for example, an ink jet printer), a personal computer (a mobile personal computer or a laptop personal computer), a television, a video camera, a video tape recorder, a car navigation apparatus, a pager, an electronic organizer (also including a communication function unit), an electronic dictionary, a calculator, an electronic game apparatus, a word processor, a workstation, a television telephone, a security television monitor, electronic binoculars, a POS terminal, a medical apparatus (for example, an electronic thermometer, a blood-pressure meter, a blood-sugar meter, an electrocardiographic apparatus, an ultrasonic diagnostic apparatus, or an electronic endoscope), a fish finder, various measurement apparatuses, meters (for example, meters for cars, airplanes, and ships), a flight simulator, a digital terrestrial broadcast, and a mobile phone base station.

3. Vehicle

Figure 9:
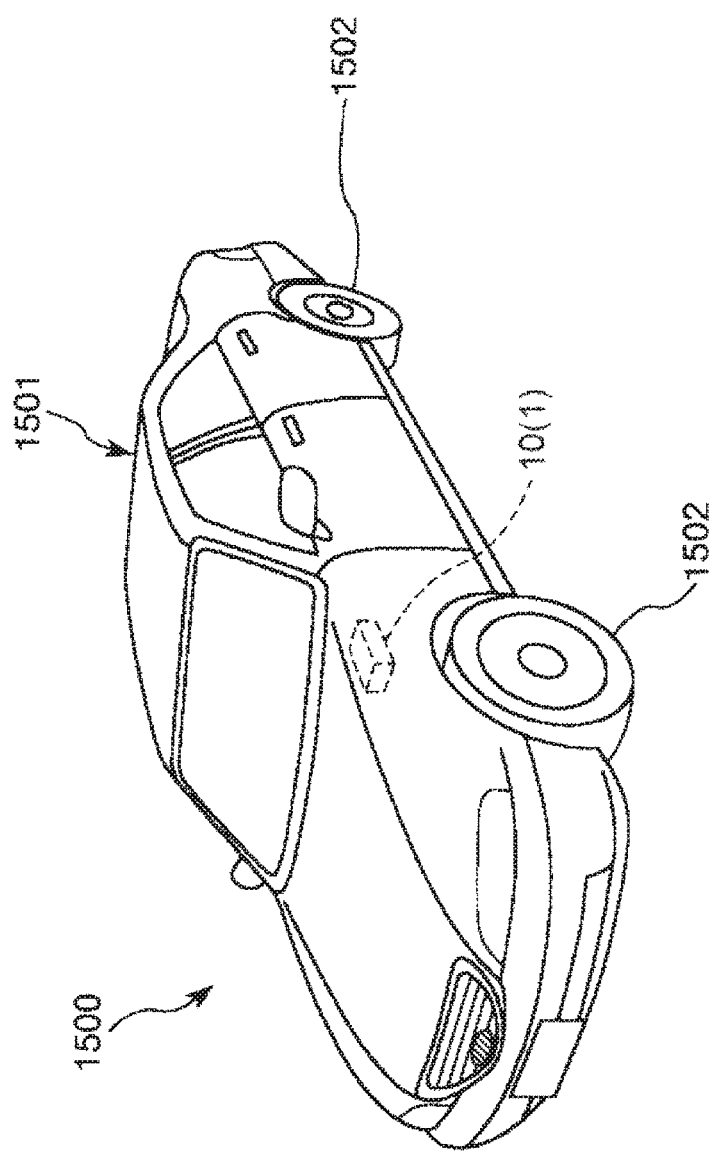
FIG. 9 is a diagram illustrating an example of a vehicle.

FIG. 9 is a diagram illustrating an example of a vehicle.

In the drawing, a vehicle 1500 includes a body 1501 and four wheels 1502 and is configured to rotate the wheels 1502 by a power source (engine) (not illustrated) disposed in the body 1501. The vehicle 1500 contains the atomic oscillator 10 (the light-emitting element module 1).

The above-described vehicle 1500 includes the above-described light-emitting element module 1. In this way, it is possible to reduce the deterioration in precision of the temperature control of the light-emitting element 3. Therefore, it is possible to realize the vehicle 1500 that has a high property using the light LL from the light-emitting element 3.

The light-emitting element module, the atomic oscillator, the electronic apparatus, and the vehicle according to the invention have been described above according to the illustrated embodiments, but the invention is not limited thereto.

The configuration of each unit according to the invention can be replaced with any configuration that has the same function as that according to the above-described embodiment and any configuration can also be added.

In the above-described embodiment, the case in which the invention is applied to the atomic oscillator that resonates and transitions cesium using coherent population trapping by two types of light with different wavelengths has been described, but the invention is not limited thereto. The invention is also applicable to an atomic oscillator that resonates and transitions rubidium or the like using a double resonance phenomenon by light and microwaves.

In the above-described embodiment, the case in which the light-emitting element module is used in the atomic oscillator has been described, but the invention is not limited thereto. The light-emitting element module can be used for all devices that adopt a light-emitting element. For example, the light-emitting element module is also applicable to a magnetic sensor and a quantum memory.

In the above-described embodiment, the case in which the base is quadrangular in the plan view has been described as an example, but the shape of the base in the plan view is not limited thereto. For example, the base is polygonal or circular other than the quadrangle.

In the above-described embodiment, the case in which the first, second, and third external electrodes are disposed on the lower surface of the base has been described as an example. The first, second, and third external electrodes may be disposed on an outer surface other than the lower surface of the base as long as the third external electrode is disposed between the first and second external electrodes when viewed in a direction in which the light-emitting element and the Peltier device overlap each other.

What is claimed is:

1. A light-emitting element module comprising:
   a Peltier device that includes a first substrate, and a second substrate causing a temperature difference from the first substrate, and a power terminal disposed on the first substrate;
   a light-emitting element that is disposed on a side of the second substrate of the Peltier device and of which temperature is adjusted by the Peltier device;
   a temperature sensor that is disposed on the side of the second substrate of the Peltier device;
   a package that includes a base and a lid joined to the base and accommodates the Peltier device and the temperature sensor;
   a heat dissipation member that is directly provided on an outer surface of the base and that is configured to dissipate heat from the base;
   a first external electrode that is disposed on the outer surface of the base and is electrically connected to the power terminal;
   a second external electrode that is disposed on the outer surface of the base and is electrically connected to the temperature sensor; and
   a third external electrode that is disposed on the outer surface of the base and is electrically connected to the light-emitting element,
   wherein the third external electrode is disposed between the first and second external electrodes when viewed in a first direction in which the light-emitting element and the Peltier device overlap each other, and wherein the heat dissipation member is located at a position closer to the first external electrode than the second external electrode when viewed in the first direction.

2. The light-emitting element module according to claim 1, further comprising:
a first internal electrode that is disposed on an inner surface of the base and is electrically connected to the power terminal and the first external electrode;
a second internal electrode that is disposed on the inner surface of the base and is electrically connected to the temperature sensor and the second external electrode; and
a third internal electrode that is disposed on the inner surface of the base and is electrically connected to the light-emitting element and the third external electrode,
wherein the third internal electrode is disposed between the first and second internal electrodes when viewed in the first direction.

3. The light-emitting element module according to claim 2,
wherein when viewed in the first direction, the first internal electrode and the first external electrode overlap at least partially, the second internal electrode and the second external electrode overlap at least partially, and the third internal electrode and the third external electrode overlap at least partially.

4. The light-emitting element module according to claim 1,
wherein when viewed in the first direction, the light-emitting element is disposed between the power terminal and the temperature sensor.

5. The light-emitting element module according to claim 1,
wherein when viewed in the first direction, an outer shape of the base is quadrangular, and
wherein the first and second external electrodes are disposed in different corners of the base.

6. An atomic oscillator comprising:
a light-emitting element module, the light-emitting element module having:
a Peltier device that includes a first substrate, and a second substrate causing a temperature difference from the first substrate, and a power terminal disposed on the first substrate;
a light-emitting element that is disposed on a side of the second substrate of the Peltier device and of which temperature is adjusted by the Peltier device;
a temperature sensor that is disposed on the side of the second substrate of the Peltier device;
a package that includes a base and a lid joined to the base and accommodates the Peltier device and the temperature sensor;
a heat dissipation member that is directly provided on an outer surface of the base and that is configured to dissipate heat from the base;
a first external electrode that is disposed on an outer surface of the base and is electrically connected to the power terminal;
a second external electrode that is disposed on the outer surface of the base and is electrically connected to the temperature sensor; and
a third external electrode that is disposed on the outer surface of the base and is electrically connected to the light-emitting element;
wherein the third external electrode is disposed between the first and second external electrodes when viewed in a first direction in which the light-emitting element and the Peltier device overlap each other; and
wherein the heat dissipation member is located at a position closer to the first external electrode than the second external electrode when viewed in the first direction;
an atomic cell that receives a light from the light-emitting element module so as to output a passed light;
a light receiver that receives the passed light from the atomic cell so as to output a detection signal; and
a controller that is configured to control the light-emitting element module based on the detection signal, the controller being configured to output a clock signal to an outside.

7. An electronic apparatus comprising:
a light-emitting element module, the light-emitting element module having:
a Peltier device that includes a first substrate, and a second substrate causing a temperature difference from the first substrate, and a power terminal disposed on the first substrate;
a light-emitting element that is disposed on a side of the second substrate of the Peltier device and of which temperature is adjusted by the Peltier device;
a temperature sensor that is disposed on the side of the second substrate of the Peltier device;
a package that includes a base and a lid joined to the base and accommodates the Peltier device and the temperature sensor;
a heat dissipation member that is directly provided on an outer surface of the base and that is configured to dissipate heat from the base;
a first external electrode that is disposed on an outer surface of the base and is electrically connected to the power terminal;
a second external electrode that is disposed on the outer surface of the base and is electrically connected to the temperature sensor; and
a third external electrode that is disposed on the outer surface of the base and is electrically connected to the light-emitting element;
wherein the third external electrode is disposed between the first and second external electrodes when viewed in a first direction in which the light-emitting element and the Peltier device overlap each other; and
wherein the heat dissipation member is located at a position closer to the first external electrode than the second external electrode when viewed in the first direction;
a signal receiver that receives an external signal;
an atomic cell that receives a light from the light-emitting element module so as to output a passed light;
a light receiver that receives the passed light from the atomic cell so as to output a detection signal; and
a controller that is configured to control the light-emitting element module based on the detection signal, the controller being configured to output a clock signal to the signal receiver.

* * * * *